US009590603B1

United States Patent
Allouche et al.

(10) Patent No.: US 9,590,603 B1
(45) Date of Patent: Mar. 7, 2017

(54) BEAM STEERABLE UWB RADAR (75) Inventors: Erez Allouche, Madison, MS (US); Arun Prakash Jaganathan, Ruston, LA (US); Bryan Cady, Ruston, LA (US); Neven Simicevic, Ruston, LA (US)

(73) Assignee: Louisiana Tech Research Corporation, Ruston, LA (US)

( * ) Notice: Subject to any disclaimer, the term of this patent is extended or adjusted under 35 U.S.C. 154(b) by 991 days.

(21) Appl. No.: 13/469,454

(22) Filed: May 11, 2012

Related U.S. Application Data (63) Continuation-in-part of application No. 12/675,480, filed as application No. PCT/US2008/074832 on Aug. 29, 2008, now Pat. No. 8,350,570.

(60) Provisional application No. 61/484,797, filed on May 11, 2011, provisional application No. 60/969,286, filed on Aug. 31, 2007.

(51) Int. Cl.
| | |
|---|---|
| *G01S 19/35* | (2010.01) |
| *H03K 5/06* | (2006.01) |
| *H01Q 3/00* | (2006.01) |
| *H04K 3/00* | (2006.01) |

(52) U.S. Cl.
CPC ............... *H03K 5/06* (2013.01); *H01Q 3/00* (2013.01); *H04K 3/228* (2013.01); *H04K 2203/32* (2013.01)

(58) Field of Classification Search
CPC ....... H03K 5/06; H01Q 3/00; H04K 2203/324
USPC .......................................................... 342/375
See application file for complete search history.

(56) References Cited

U.S. PATENT DOCUMENTS

| | | | | |
|---|---|---|---|---|
| 3,629,743 A | * | 12/1971 | Berney | ............................ 334/89 |
| 3,728,632 A | * | 4/1973 | Ross | ....................... H01Q 9/005 |
| | | | | 327/181 |
| 3,925,781 A | * | 12/1975 | Hulett et al. | ................... 342/399 |
| 4,806,937 A | * | 2/1989 | Peil | ............................... 342/175 |
| 6,573,721 B1 | | 6/2003 | Cull | |
| 6,664,914 B2 | * | 12/2003 | Longstaff et al. | .............. 342/22 |
| 6,672,409 B1 | | 1/2004 | Dock et al. | |
| 6,956,534 B2 | | 10/2005 | Hagiwara | |
| 7,508,336 B2 | | 3/2009 | Leskin | |
| 7,539,271 B2 | | 5/2009 | Shor et al. | |
| 7,570,063 B2 | | 8/2009 | Van Veen et al. | |
| 7,864,870 B2 | | 1/2011 | Tekin | |
| 8,174,443 B2 | | 5/2012 | Markus | |
| 8,350,570 B2 | * | 1/2013 | Allouche et al. | .............. 324/337 |
| 2001/0038318 A1 | * | 11/2001 | Johnson et al. | .............. 331/135 |

(Continued)

FOREIGN PATENT DOCUMENTS

| | | |
|---|---|---|
| CN | 101392642 A | 3/2009 |
| WO | 2009/029819 * | 3/2009 |
| WO | WO2013/049377 A1 | 4/2013 |

OTHER PUBLICATIONS

International Searching Authority, International Search Report and Written Opinion issued in PCT/US2008/074832; Nov. 19, 2008.

(Continued)

*Primary Examiner* — Frank J McGue
(74) *Attorney, Agent, or Firm* — Jones Walker LLP (57) ABSTRACT

An adaptive UWB radar front-end that can a) automatically tune the pulse width for target type and depth; b) automatically sweep specific area by controlling the timing (delay); and, c) for each steering direction, it can automatically adjusts the power distribution for improving radiation pattern and thus improving signal quality for clutter free imaging.

12 Claims, 5 Drawing Sheets

(56) References Cited

U.S. PATENT DOCUMENTS

| | | |
|---|---|---|
| 2003/0090407 A1* | 5/2003 | Santhoff .............. A61B 5/0059 |
| | | 342/22 |
| 2004/0183899 A1 | 9/2004 | Shiota |
| 2005/0115337 A1 | 6/2005 | Tarumi |
| 2008/0211727 A1* | 9/2008 | Elmore ..................... H01P 3/10 |
| | | 343/773 |
| 2011/0196534 A1 | 8/2011 | Ekes et al. |
| 2013/0082866 A1 | 4/2013 | Jaganathan |
| 2013/0113646 A1 | 5/2013 | Allouche et al. |

OTHER PUBLICATIONS

International Searching Authority, International Preliminary Report on Patentabililty issued in PCT/US2008/074832; Jan. 22, 2010.

Picosecond Pulse Labs; Real-Time Sampling Downconverter Front Ends for Digital Radar and Wide-Band Signaling; Nov. 2004; Boulder, Colorado.

International Searching Authority; International Search Report and Written Opinion issued in PCT/US2012/057604; Dec. 27, 2012.

PCT Application No. US2012/057604; International Preliminary Report on Patentability for Applicant Louisiana Tech University Research Foundation; a Division of Louisiana Tech University Foundation, Inc., et al. dated Apr. 10, 2014.

* cited by examiner

BEAM STEERABLE UWB RADAR

This application claims the benefit under 35 USC 119(e) of U.S. provisional application Ser. No. 61/484,797 filed May 11, 2011, which is incorporated by reference herein in its entirety.

This invention was made with government support under contract number 70NANB9H9009 awarded by National Institute of Standards and Technology. The government has certain rights in the invention.

BACKGROUND OF INVENTION

Ultra-wideband (UWB) electromagnetic pulses in radar systems for non-destructive testing have proven to provide higher resolution data than traditional ground penetrating radar (GPR). Thus, UWB radar systems are an effective manner for carrying out underground detection and infrastructure inspection, which often requires minimization of the waveform distortion and satisfaction of the Federal Communications Commission (FCC) emission mask on power spectrum density in the frequency range of 3.1-10.6 GHz. All radar systems generally consist of a pulse generator, emitting and receiving antennas, and receiver electronics. UWB radar systems emit electromagnetic pulses from an antenna and the reflected signal is used to determine the presence, location and attributes of the target. Due to the requirement on the emission mask and the environment in which inspection systems are intended to be used, desirable physical characteristics of pulse emitting antennas include high gain and directivity, low profile, robustness, simplicity, and low cost. It is also desirable that the waveforms contain minimum distortion and ringing, and also satisfy the Federal Communications Commission's (FCC) emission mask on power spectrum density in the frequency range of about 3.1-10.6 GHz.

DETAILED DESCRIPTION OF SELECTED EMBODIMENTS

Figure 7:
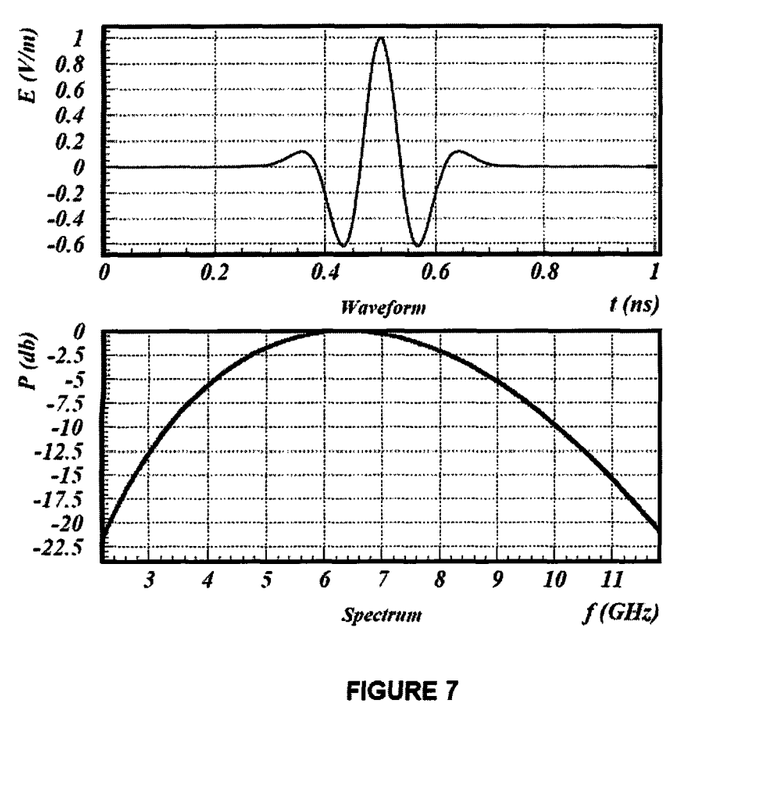
FIG. 7 illustrates the waveform and frequency spectrum of the fourth derivative of a Gaussian pulse.

One embodiment of the present invention is a steerable signal direction system. One of the ways to direct the antenna radiated power in a desired angular sector, and, at the same time, satisfy the above mentioned requirements, is to utilize a multi-element antenna array. Each element of the antenna array would be fed by electromagnetic pulse satisfying the FCC emission mask, examples of which are the fourth and fifth derivative a Gaussian pulse:

$$E = \frac{E_0}{\tau_p^4}\left[\frac{(t-t_0)^4}{\tau_p^4} - 6\frac{(t-t_0)^2}{\tau_p^2} + 3\right] \cdot e^{\frac{(t-t_0)^4}{2\tau_p^2}}$$

$$E = \frac{E_0}{\tau_p^6}(t-t_0)\left[\frac{(t-t_0)^4}{\tau_p^4} - 10\frac{(t-t_0)^2}{\tau_p^2} + 15\right] \cdot e^{\frac{(t-t_0)^4}{2\tau_p^2}}$$

where $E_0$ is the amplitude of the pulse, and $T_p$ is the pulse width of the original Gaussian pulse. FIG. 7 suggests that in the case of a fourth derivative Gaussian pulse, the pulse width of the generated Gaussian pulse has to be of the order of 50 picoseconds to satisfy the FCC mask.

Figure 1:
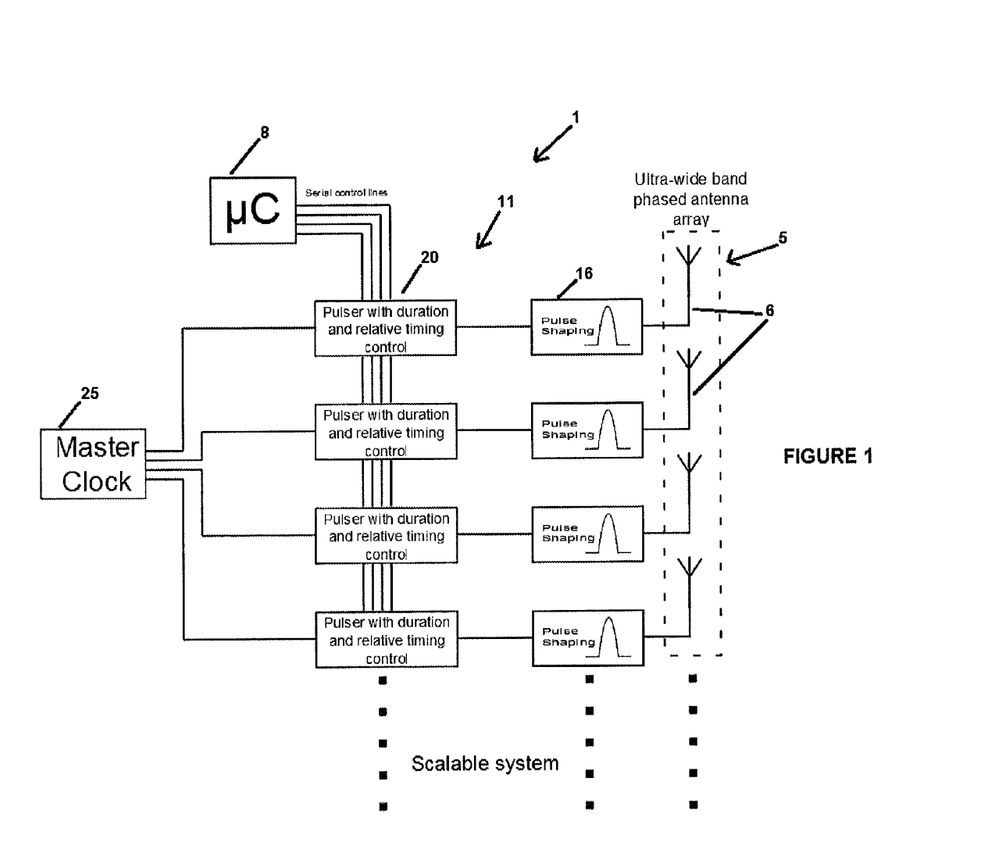
FIG. 1 illustrates schematically an electronically tunable radar system.

An example of one steerable signal direction system is shown in FIG. 1. This embodiment of steerable signal direction system 1 generally includes an antenna array 5 having at least two individual antennas or antenna elements 6, a pulse generating circuit 11, a controller 8, and a clock 25. As a brief overview of the system's function, it will be understood that the direction of the electromagnetic energy radiating from the antenna array can be electronically programmed to focus in a particular direction. By programming a delay in the signals being fed to individual antenna elements of the array, the direction of beam can be controlled by the superimposition of signals adding constructively in the desired direction and destructively in other directions. This enables the radar to cover a wider area without having to mechanically rotate the antennas and often produces better quality data than a single direction antennas can achieve. Although not specifically illustrated, it will be understood that the antenna array and associated electronics may be mounted on a conventional robotic carrier and communicated to a remotely located operator though an umbilical cord or via a wireless communication link. One non-limiting example of a suitable robotic carrier is the Pipe Ranger™ available from CUES Corporation of Orlando, Fla.

Figure 2:
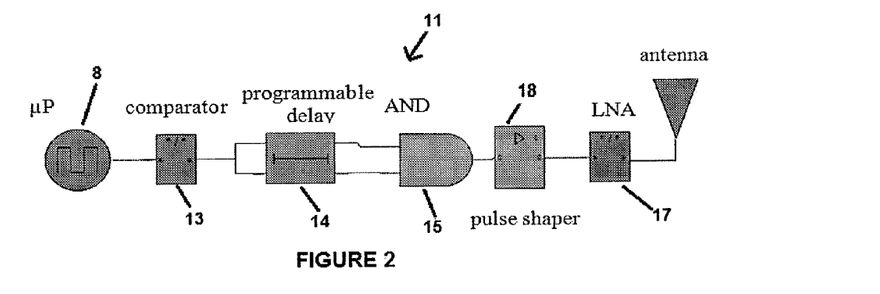
FIG. 2 illustrates one embodiment of the pulse generation circuitry.

One embodiment of a pulse generator which may be utilized in the system is seen in FIG. 2. The pulse generator 11 will generally include (1) a micro-controller 8 producing a waveform; (2) a programmable delay circuit 14 splitting the initial signal into at least two subsequent signals and delaying the output of at least one of the split signals; (3) an AND gate 15 acting to adjust a pulse width of the output signal based upon the delay between the signals input from the delay circuit; and (4) a signal shaper/differentiator 18 for reducing frequency contents outside a given frequency range. In a preferred example, the signal shaper reduces the power level of the incoming signals with frequency outside 3.1 to 10.6 GHz by at least 10 dB. This embodiment of pulse generator 11 may also include a low noise amplifier 17.

The embodiment of FIG. 2 uses the microcontroller 8's clock source to generate a square waveform which is passed through voltage comparator 13 to sharpen the edges of the square pulse. Other embodiments may be able to eliminate the comparator if the electronics utilized have a sufficiently fast rise and fall time to create very well defined square waves. In one embodiment, the square wave generated by the microcontroller is in the MHz range and has between about a 30% and about a 70% duty cycle. One preferred embodiment employs a baseband clock signal having a rise time of anywhere between about 10 nanoseconds to about 100 picoseconds. The square pulse is then split-up into two signals with one signal slightly delayed using programmable delay circuit 14. Preferably the delay between the two signals could range anywhere between about 3 picoseconds and about 4 nanoseconds depending on the pulse length desired. The two signals from programmable delay circuit 14 enter the AND gate 15 to produce and ultra-short pulse (e.g., a few nanoseconds to about 50 picoseconds). In a preferred embodiment, AND gate 15 is an ultra-fast AND with rise and fall time of at least less than about 100 picoseconds, and more preferably less than about 50 picoseconds. The width of the pulse generated from AND gate 15 may be electronically tuned by adjusting the delay introduced into one of the signals entering AND gate 15 using the programmable delay circuit 14. The pulse output from AND gate 15 may be sufficiently short (e.g., less than 100 pico seconds as measured in terms of full width at half maximum (FWHM), but its spectral contents may cross outside of a desired envelope, for example the Federal Communications Commission (FCC) envelope of 3.1 to 10.6 GHz. In order to filter the frequency contents that lie outside the desired band without introducing ringing, the signal is passed through a signal shaper (differentiator) 16. In one embodiment, signal shaper 16 may be a passive differentiator which uses the time derivative of the input signal to shape and fit the frequency content of the output signal within a given frequency (e.g., FCC mandated) envelope. The pulse output from the signal shaper is finally amplified using low noise amplifier 17.

Antenna elements 6 can take a variety of shapes or types. As nonlimiting examples, the antenna elements may be one of discone, dipole, or bi-conical antenna types. Generally, it is preferred that the antenna elements are designs conducive to the transmission of UWB signals. Although the figures illustrate a certain number of antenna elements in the array, it will be understood that the system is scalable to accommodate any number of elements in the array.

Figure 3:
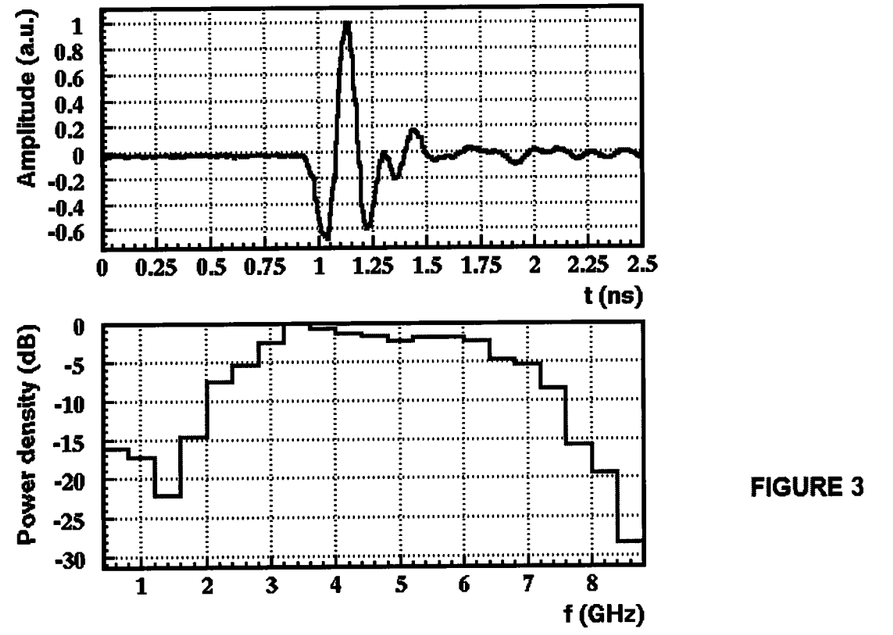
FIG. 3 illustrates one example of the measured pulse output from a pulse generator such as seen in FIG. 2.

As one example of the commercially available components forming this pulse generator, micro-controller 8 could be a C2000 series from Texas Instruments; programmable delay circuit 14 could be a On-Semi MCP10EP195FAG, AND gate 15 could be a high-speed AND gate such as Hittite HMC672LC3C, signal shaper/differentiator 18 could be Picosecond 5216; and low noise amplifier 17 could be a Picosecond 5866. FIG. 3 shows one experimental example of final pulse output, along with the power density, created by a pulse generator of FIG. 2 as described above.

In certain embodiments, the system processor serially controls a delay chip corresponding to each pulse generator. For example, the delay chip may be controlled by digital inputs comprising 11 digits of 0 and 1 arranged in certain sequence. Depending on this sequence, the delay time is changed. Thus, 00000000000 could correspond to zero delay and 00000000001 correspond to a delay of 10 picoseconds and so on; these 11 digits would be fed serially into the delay chip.

The programmable pulse generator 11 described above may be employed to construct one embodiment of the steerable signal direction system 1, which is a beam steerable UWB array. "Electronic beam-steering" refers to the technique of incrementally changing the direction of electromagnetic radiation emanating from radar without mechanically rotating the antennas. Advantages of an electronic steering mechanism over mechanically controlled system would include compactness of the system (no bulky motor/gear assembly), faster scan times (easier to change the direction using an electronic controller than physical rotation) and mechanically rigidity with no moving parts. One application of such a system would be utilizing electronic steering radar for internal pipeline inspection to detect out-of-pipe voids. A physically immovable radar directing the energy in a single direction, say toward the crown of the pipe, would only provide one dimensional information about the pipe at that particular location along the length of the pipe. However, by implementing beam steering a 2-D view of the pipe at that particular location along the pipe would be obtained. Eventually a 3-D view of the pipe could be generated by overlaying all of the 2-D plots. Thus, a beam steerable radar could provide much more information about the pipe than a fixed non-steerable radar. This approach also tends to minimize the distortion in data that might be caused due to the uneven movements of the robot as it transverses through debris and other bumps found in sewers and similar environments. In one embodiment, using beam steering to correct for robot movement is accomplished by employing a sensor which can calculate the mechanical position change of the robot and the error due to that change. With this information, an error value relative to a set point (i.e., the desired position) may be determined and feedback instructions created to steer the beam accordingly. There are many different ways to accomplish this, for example: a) using an ultrasonic sensor to measure the distance from a pipe wall; b) using a multiple axes MEMS gyroscope; c) using a two axes tilt sensor; or d) a fixed reference point (reflector) at a manhole and a laser beam on the carrier (or vice versa).

In certain embodiments, the electronic beam steering is capable of operation over a range of about 60° (e.g., −30° to)+30°. In these embodiments, it may be desirable to have a large scale mechanical rotation of the antenna array at various points such that electronic beam steering may cover an entire 360° circumference. For example, the antenna array may mechanically rotate to positions of 0°, 60°, 120°, 180°, 240°, and 300° in order to allow the 60° electronic beam steering range to operate between those angles.

In certain embodiments, the system will have a repetition rate (i.e., how fast two consecutive pulses are sent to the antennas) of between about 1 kHz and about 100 MHz. The repetition rate is relevant to how fast a carrier vehicle can travel when scanning a road surface. For example, in a typical sewer application where the transporter robot travels a few feet per second, a 1 MHz repetition rate is likely adequate to allow scanning of a 360° circumference as the transporter robot travels down the pipe. It will also be understood that in many embodiments, the individual channels of the pulse generators in the system may be programmed such that the signal fed into the individual elements of the multi-element antenna may be delayed independently. In certain embodiments, steering the electronic beam is accomplished by delaying the individual signals fed to the antenna elements, i.e., signal delay to individual elements is accomplished as a true time delay (TTD) as opposed to frequency dependant phase shifter based delay. While there may be many different ways to move (i.e., delay or shift) the output signal in the time axis, one preferred technique is by physically delaying an output signal after it has been generated by passing it through a comparatively longer path. Alternatively, the system controller may simply wait for a short duration before it produces the signal for the next antenna element (this later technique being referred to as "digitally delayed" signal shifting).

For embodiments such as seen in FIG. 1, it will be understood that the system employs a separate generator for each antenna. However, alternate embodiments could conceivable share a generator between more than one antenna.

Figure 4:
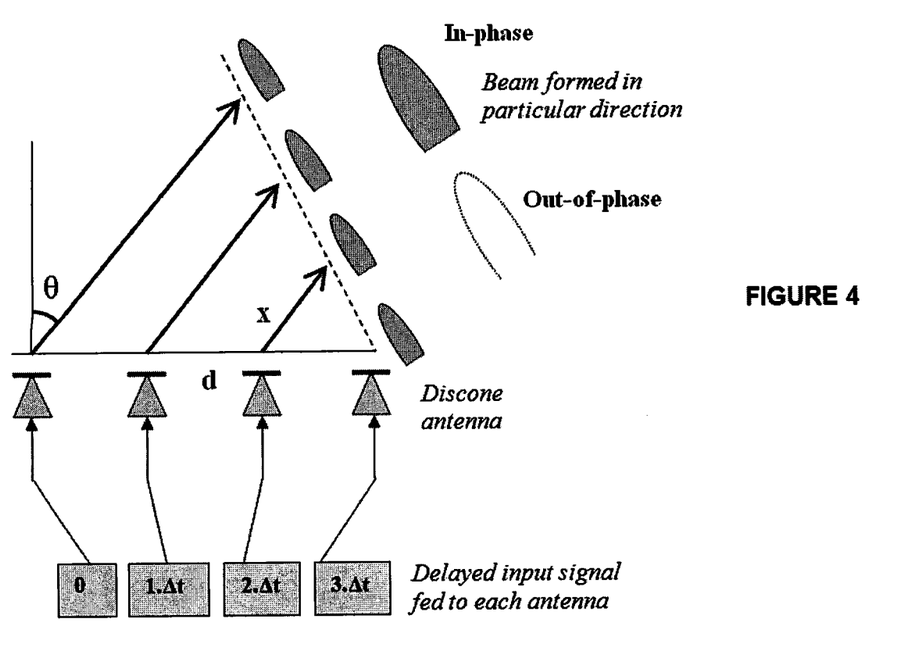
FIG. 4 illustrates schematically the time delay based beam steering of the radar signal.
Figure 5:
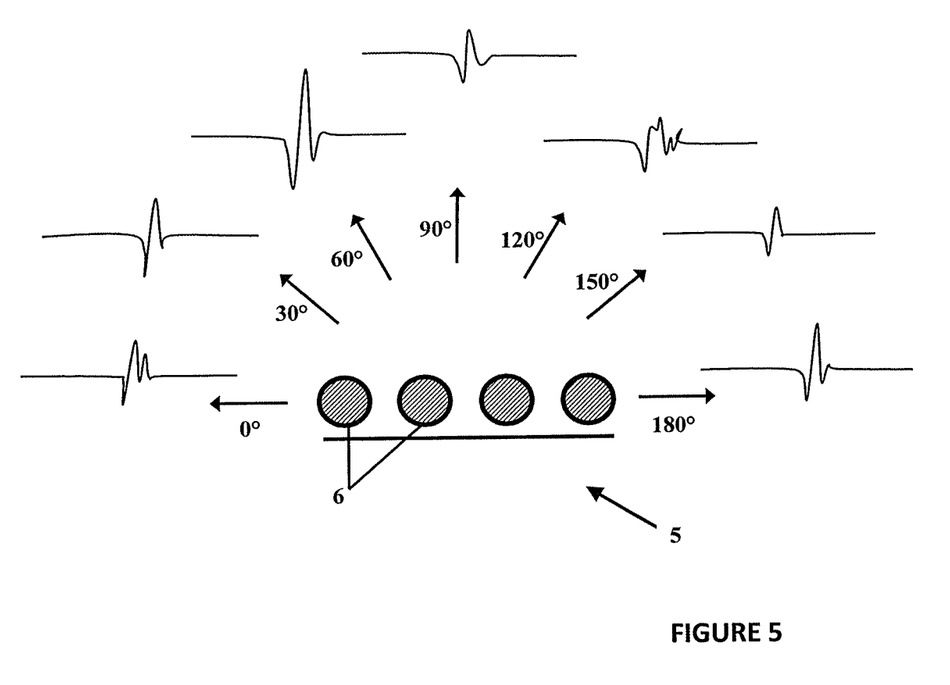
FIG. 5 illustrates schematically the increased signal amplitude of the selected beam direction.
Figure 6:
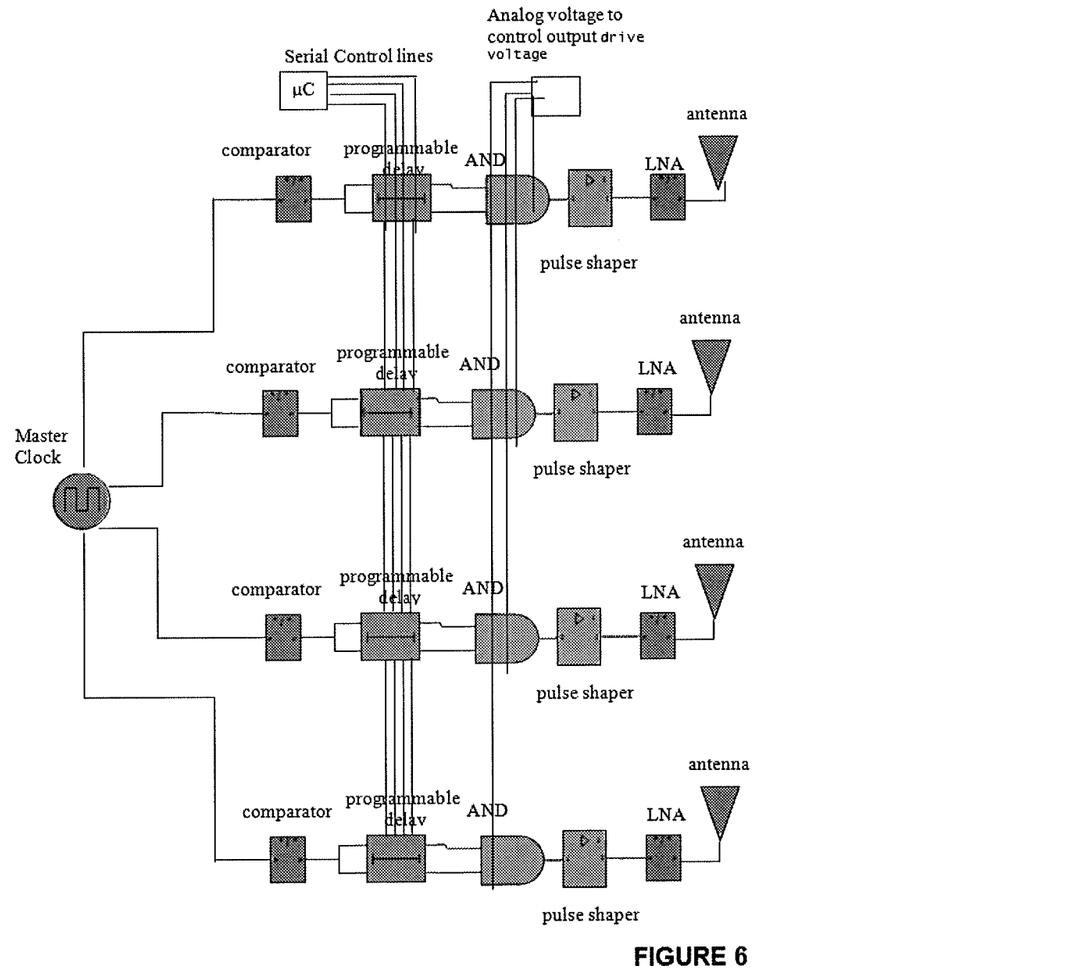
FIG. 6 an alternative embodiment of circuitry for a steerable signal system.

As described above, certain embodiments of the present invention achieve beam steering by delaying the individual signals fed to the individual antenna elements of the antenna array. Thus, where the antenna array comprises "x" antenna elements, the pulses are transmitted sequentially to the antenna elements with delays of 0 Δt, 1 Δt, . . . (x−1)Δt, for the respective antenna elements. For example, to steer the beam radiating from a four element Discone antenna array as suggested in FIG. 4, the signals fed to individual elements will be delayed by a factor of Δt. Referring to FIG. 4, in order to steer the beam θ=5 degrees from the normal direction of signal propagation (in this example straight up toward the crown of the pipe), the input signal has to delayed by a factor of 10 picoseconds. Thus the delay between the second, third and fourth antenna elements would be 10, 20 and 30 picoseconds, respectively. For any particular delay factor of Δt, signals from each element will add constructively only in one particular direction and all other directions will have destructive interference. FIG. 1 is an example of this embodiment showing a schematic of the entire circuitry for the front-end of the beam steerable radar. FIG. 5 suggests how this configuration would function if the main beam is tilted 30 degrees from the normal direction such that beam along 60 degrees has amplitude at least 3 times that of other directions.

These embodiments of pulse generator 11 may be considered "tunable" in the sense that the range of pulse widths possible from the generator may be varied by the controller programmably varying the signal it initial sends to the comparator 13. Resolution of a radar is directly dependent on the width of the pulse used and thus by producing ultra short pulses, high resolution UWB radar is possible. Depending on the nature of the application in which the system is used (either requiring short inspection depths with high resolution or deeper inspection depths), pulse widths can be adjusted by modifying the clock signal generated by the controller in order to suit the particular requirements. Thus, a single pulse generator may be suitable for multiple applications.

Although the range of pulse widths is virtually unlimited, in certain embodiments the pulse width will vary from a few nanoseconds scale to less than 100 picoseconds, for example about 5 nanoseconds to about 10 picoseconds (or any sub-range in between), and more preferably, between about 100 picoseconds and about 300 picoseconds. The larger width pulses are better suited to identifying buried utilities located below several feet beneath the soil surface while the shorter width pulses are better suited to estimating the wall thickness of buried pipes. Likewise, pulses with width less than 100 pico-seconds would be able to resolve the inner and outer wall of a buried non-metallic pipe and thus accurate wall thickness measurement of sewer pipes (reinforced concrete and vitrified clay pipes) are feasible. Other example uses might include inspection of buried sewers, buried utility location, bridge deck inspection, and inspection of dam and levy walls. Naturally, these are only a few example uses of the device and many other measurement and status determinations of conduits are possible. The beam steering technique also has potential applications beyond inspection of structures. For example, in a communications application, separately modulated signals could be sent to multiple specific physical locations from a single fixed antenna at ultra-high speed for UWB digital radio applications.

Several advantages may be achieved by being able to selectively steer the radar beam. For example, steering the radar beam will allow correcting for changes in the antenna's physical position to allow maintaining the beam focused on a specific physical region of the target area regardless of the physical movement of the antenna. Likewise, timing correction factors may be utilized to compensate for minor imperfections in antenna elements, hardware and timing signals to achieve optimal performance.

In a further embodiment, the system may produce a pulse which has a single differential output or two single channel outputs; i.e., one used for exciting an antenna structure and the other for timing control or a similar function. Certain radio frequency amps and equipment require a differential signal feed. This modification would allow the pulser to connect without special splitters. If used in a single channel system, the extra channel could be used to signal to other electronics exactly when the pulse leaves the device. This would provide a very accurate signal off of which a receiver system could be timed.

In many embodiments, signal delay to individual elements is accomplished as a true time delay (TTD) as opposed to frequency dependant phase shifter based delay. TTD may introduced in the baseband signal by creating a delay in the trigger signal used for producing the pulse. Alternatively, a phase shifter is a frequency dependant device. Since often the signal being employed has a wide bandwidth, a phase shifter may have the disadvantage of having to shift all frequencies of the signal equally.

In certain embodiments, a power splitter is used to split a single signal into several signals to feed an antenna array. Where it is desired to change the direction of the radiation, individual signals have to be delayed separately.

Another embodiment varies the power distribution (depending on the beam direction, the amplitude of the signal fed to corresponding elements can be varied) for improving/optimizing the radiation pattern, and thereby radiates a substantially lower noise signal. In most applications the antenna array is designed to produce a narrow beam (main lobe) toward a predefined direction. Radiation into an undesired direction (side lobes) can be reduced by non-uniform power distribution among antenna array elements, and the relation between the width of the main lobe and level of the intensity of the side lobes radiation is well established. Uniform power distribution produces the narrowest width of the main lobe, but also the largest level of side lobes. Non-uniform power distribution among the antenna array elements lowers the intensity of the side lobes, but increases the width of the main lobe. Depending on the tradeoff between width of the main lobe and the intensity of the side lobes, the non-uniform power distribution among the array elements can have, for example, the form of Dolph-Chebyshev, Taylor-Kaiser, or binomial distribution. For example, in the case of five-element antenna array with elements separated by half wavelength, the power will be distributed between the array elements in the ratio 1:4:6:4:1. The power will be distributed among the antenna elements using pre-designed power dividers.

An alternate embodiment is a steerable signal direction circuit wherein a UWB radar can be programmed to automatically adapt for specific targets and environments by: (a) automatically tuning the pulse width depending on the depth of penetration and size of target required; (b) sweeping a specific area by steering the beam using digitally controlled delay of signals fed to the antenna elements; or (c) varying the power distribution (depending on the beam direction, the amplitude of the signal fed to corresponding elements can be varied) for improving/optimizing radiation pattern, and there by radiating a noise free signal, thereby reducing the clutter in the images obtained and improving the ability to discern/extract features of interest with a higher level of reliability.

A further alternate embodiment is a steerable signal direction circuit comprising: a programmable power distribution such that the amplitude of the signal fed to each antenna element can be varied along with the timing (delay) to improve the radiation pattern for every steering directions, thereby improving the quality of the radiated signal; varying the signal delay changes the direction of radiation while varying the power distribution, thereby improving the quality of the radiated signal with less ring in order to obtain a less cluttered image, particularly in non-destructive testing applications.

A still further embodiment is a steerable signal direction circuit where in the master controller enables/disables specific pulse generating units as to activate/deactivate predetermined number of antenna elements to accomplish the following: (a) achieving specific directivity; (b) converting a linear broad-side viewing array to a side-viewing end-fire array (thereby assisting imaging inside a space restricted environment such as cavities and bore holes; (c) achieving specific radiation pattern, e. g. changing a half power beam width, or converting a linear broad-side viewing array to a side-viewing end-fire array; and (d) changing the antenna gain.

Although certain embodiments of the present invention have been described above, those skilled in the art will recognize many obvious modifications and variations. All such modifications and variations are intended to come within the scope of the following claims.

We claim:

1. A steerable signal direction circuit comprising:
   a. an antenna array comprising "x" antenna elements, wherein "x" is at least two;
   b. a pulse generator connected to each antenna element, the pulse generator including a delay circuit and configured to create a pulse with variable duration;
   c. a processor serially controlling the delay circuit corresponding to each pulse generator, thereby tuning the width of a pulse produced by each pulse generator;
   d. a clock controlling a sequence and timing in which pulses are transmitted to the antenna elements;
   e. wherein pulses are transmitted sequentially to the antenna elements with time delays of 0 $\Delta t$, 1 $\Delta t$, ... (x-1)$\Delta t$, for the pulses being received at the respective antenna elements; and
   f. wherein $\Delta t$ is between approximately 10 psec and approximately 50 psec for each 5° deviation from a direction normal to the antenna.

2. The steerable signal direction circuit according to claim 1, wherein the antenna elements are one of discone, dipole, or bi-conical antenna type.

3. The steerable signal direction circuit according to claim 1, wherein the antenna elements are configured for transmission of UWB signals.

4. The steerable signal direction circuit according to claim 1, wherein the pulse delays are configured to correct for changes in the antenna's physical position, thereby allowing maintenance of beam focus on a specific physical region of a target area when there is physical movement of the antenna array.

5. The steerable signal direction circuit according to claim 1, further comprising a robotic carrier having the steerable signal direction circuit mounted thereon.

6. A steerable signal direction circuit comprising:
   a. an antenna array including "x" number of antenna elements, wherein "x" is at least two;
   b. a pulse generating circuit directing signal pulses to the antenna elements;
   c. a clock producing a waveform for the pulse generating circuit;
   d. a controller controlling the pulse generating circuit and clock in order to transmit signal pulses sequentially to the respective antenna elements with time delays of 0 $\Delta t$, 1 $\Delta t$, ... (x-1)$\Delta t$;
   e. wherein $\Delta t$ is selected such that signal pulses will add constructively in a desired direction and interfere destructively in other directions; and
   f. wherein $\Delta t$ is between about 5 psec and about 50 psec for each 5° deviation from a direction normal to the antenna.

7. The steerable signal direction circuit according to claim 6, wherein $\Delta t$ is selected to cause electronic beam steering over a range of about −30° to about +30° relative to the mechanical position of the antenna array.

8. The steerable signal direction circuit according to claim 6, wherein $\Delta t$ is approximately 10 psec for each 5° deviation from the direction normal to the antenna.

9. The steerable signal direction circuit according to claim 6, further comprising a robotic carrier having the steerable signal direction circuit mounted thereon.

10. The steerable signal direction circuit according to claim 6, wherein the antenna elements are one of discone, dipole, or bi-conical antenna type.

11. The steerable signal direction circuit according to claim 6, wherein the antenna elements are configured for transmission of UWB signals.

12. The steerable signal direction circuit according to claim 11, wherein the UWB signals have a pulse width of between about 50 psecs and about 300 psecs.

* * * * *